United States Patent [19]

Adams et al.

[11] Patent Number: 4,993,534

[45] Date of Patent: Feb. 19, 1991

[54] METHOD AND APPARATUS FOR RELIABLE INTEGRATED CIRCUIT PACKAGE CONSTRUCTION

[75] Inventors: Anthony L. Adams, Wylie; John G. Stewart, Dallas, both of Tex.

[73] Assignee: Texas Instruments Incorporated, Dallas, Tex.

[21] Appl. No.: 267,743

[22] Filed: Nov. 2, 1988

Related U.S. Application Data

[63] Continuation of Ser. No. 85,296, Aug. 10, 1987, abandoned, which is a continuation of Ser. No. 755,233, Jul. 15, 1985, abandoned.

[51] Int. Cl.⁵ .............................................. B65G 37/00
[52] U.S. Cl. ............................ 198/347.3; 198/463.4; 198/464.2
[58] Field of Search .......... 198/347, 341, 463.4–464.4, 198/438, 441; 406/88, 89, 191, 194, 347.3; 221/278, 266

[56] References Cited

U.S. PATENT DOCUMENTS

| | | | |
|---|---|---|---|
| 3,535,003 | 10/1970 | Rudszinat et al. | 198/441 X |
| 3,602,357 | 8/1971 | Schubert | 198/441 X |
| 3,664,891 | 5/1972 | Schubert et al. | 198/438 X |
| 3,667,587 | 6/1972 | Preston | 198/441 X |
| 3,685,633 | 8/1972 | Rudszinat et al. | 198/438 |
| 3,976,190 | 8/1976 | Schmermund | 198/347 |
| 4,178,113 | 12/1979 | Beaver, II et al. | 198/347 X |
| 4,274,530 | 6/1981 | Carter et al. | 198/347 |
| 4,301,958 | 11/1981 | Hatakenaka et al. | 198/341 |
| 4,499,987 | 2/1985 | Long | 198/347 |

FOREIGN PATENT DOCUMENTS

2097744  11/1982  United Kingdom ............... 198/347

Primary Examiner—H. Grant Skaggs
Assistant Examiner—D. Glenn Dayoan
Attorney, Agent, or Firm—B. Peter Barndt; Melvin Sharp; James T. Comfort

[57] ABSTRACT

A system for producing integrated circuit devices includes first and second integrated circuit processing stations. The first station produces an output stream of individual, separate devices for delivery to the second station. A drum buffer receives the individual devices from the first station, selectively stores the individual devices, and dispenses the stored devices on a substantially last-in first-out basis to the second station. The drum buffer includes a plurality of device carrying channels axially along the length of the drum to receive the devices being selectively stored by filling the respective channels as the drum is rotatably indexed in one direction, and to empty the stored devices from the respective channels as the drum is rotatably indexed in an opposite direction.

22 Claims, 3 Drawing Sheets

METHOD AND APPARATUS FOR RELIABLE INTEGRATED CIRCUIT PACKAGE CONSTRUCTION

This application is a continuation, of application Ser. No. 085,296, filed 8/10/87 which is a continuation of Ser. No.: 755,233, filed 7/15/85 both abandoned.

BACKGROUND OF THE INVENTION

1. Field of the Invention

This invention relates to improvements in methods and apparatuses for selecting, conveying and storing integrated circuits, and, more particularly, to improvements in methods and apparatuses for facilitating the automatic fabrication of integrated circuit packages or containers.

2. Background Information

In the construction of integrated circuits, typically the integrated circuits are fabricated or processed at a plurality of different workstations or sites. Often the circuits are manually transported between or among the various workstations or sites singly or in groups as the fabrication and testing processes are sequentially performed. In the manufacture of some kinds of integrated circuits for example, a chip or bar may be mounted onto a lead frame or film, which is thereafter mounted onto a base, usually of plastic or ceramic. Finally, a lid or cover is positioned upon and glued or otherwise affixed to the base to completely enclose the integrated circuit chip in a package ready for use.

In many installations, many if not all of the individual fabrication steps has been accomplished automatically, and, with the advent of computer technology, each of the steps has been performed with increasing reliability. Typically in the past each of the steps has been performed at individual work stations with manual inspection of the parts produced at the various stages of construction. A typical integrated circuit package fabrication process in a plastic container (one of the many types to which the invention pertains) includes mounting the integrated circuit chip onto a lead frame to create a combination which can be mounted onto a header bar. This may, for example, be accomplished during a first work shift. The mounted header bars are then generally manually carried in bulk to manual inspection stations. Although ideally immediate inspection of the intermediate header bar work product is desired, as a practical matter, typically inspection may be delayed one or more work shifts. Thereafter, in similar fashion, the inspected parts may be carried in bulk to a bonding station, at which wire leads are bonded to the integrated circuit chip and the lead film. Again, practically speaking, this bonding process, may occur one to one and one-half days after the first inspection, or even later in some cases. After the bonding process, the work product is carried in bulk to a second inspection station at which the product is again inspected, usually 24 hours or so after the bonding process has been completed.

It can be appreciated that due to the large times in the various stages of fabrication before final inspection primarily resulting from the various inspection processes and manual interstation transportation of the devices, if any malfunctions in the equipment or fabrication processes occur, a large number of bad or rejectable integrated circuit products may be constructed before the error can be detected and corrected. This can be particularly expensive in the manufacture of many state-of-the-art integrated circuits such as a 256K bit DRAM, and such complex devices.

In the past, for instance, not untypically in manual processes, overall yields of only about 85 to 90% have been experienced.

Many arrangements for automatically fabricating and bonding semiconductor devices have been advanced. An example of such system can be seen in U.S. Pat. No. 4,301,958, which includes a plurality of workstations interconnected by a vertically oriented magazine into which strips carrying the integrated circuit lead frames are received and dispensed for movement of the frames between workstations, in accordance with a predetermined flow process.

BRIEF DESCRIPTION OF THE INVENTION

In light of the above, it is, therefore, an object of the invention to present an improved method and apparatus for the manufacture of integrated circuits and integrated circuit packages.

It is another object of the invention to present a method and apparatus of the type described which automatically completes the fabrication process.

It is another object of the invention to provide a method and apparatus of the type described in which the reliability of manufacture can be significantly increased from that heretofore experienced, especially manual operations often times encountered. It is another object of the invention to provide an apparatus for facilitating the automatic transportation of workpieces of integrated circuit packages, or the like, from one workstation to another.

It is another object of the invention to provide a workpiece transportation apparatus of the type described which receives and releases workpieces on a last-in, first-out basis.

It is another object of the invention to provide a method and apparatus of the type described in which quality testing or inspecting can be accomplished with very little lag time between the inspection process from the individual assembly steps.

These and other objects, features and advantages will become apparent to those skilled in the art from the following detailed description when read in conjunction with the accompanying drawings and appended claims.

The invention, in its broad aspect, presents a manufacturing system for producing integrated circuit devices. The system includes a header bar mounting apparatus, bonding apparatus, and inspection apparatus, each of which produces an output of integrated circuit devices in various stages of manufacture. Means are provided for transferring the parts from each manufacturing stage to the next, and includes a parts receiving buffer for temporarily storing the parts between work stations and means for dispensing the stored parts on a last-in first-out basis. The buffer, in a preferred embodiment, comprises a rotary drum for receiving parts within part carrying channels axially formed along the length of the drum. The parts are stored within the channels in one direction of rotation of the drum when storage is necessary and are dispensed from the channels in an opposite direction of rotation of the drum when storage is not necessary.

BRIEF DESCRIPTION OF THE DRAWING

The invention is illustrated in the accompanying drawing in which.

In the figures of the drawing, like reference numerals are used to denote like or similar parts. It should be noted that the sizes and dimensions of various parts have been exaggerated or distorted for clarity of illustration and ease of description.

DETAILED DESCRIPTION OF THE PREFERRED EMBODIMENTS

Figure 1:
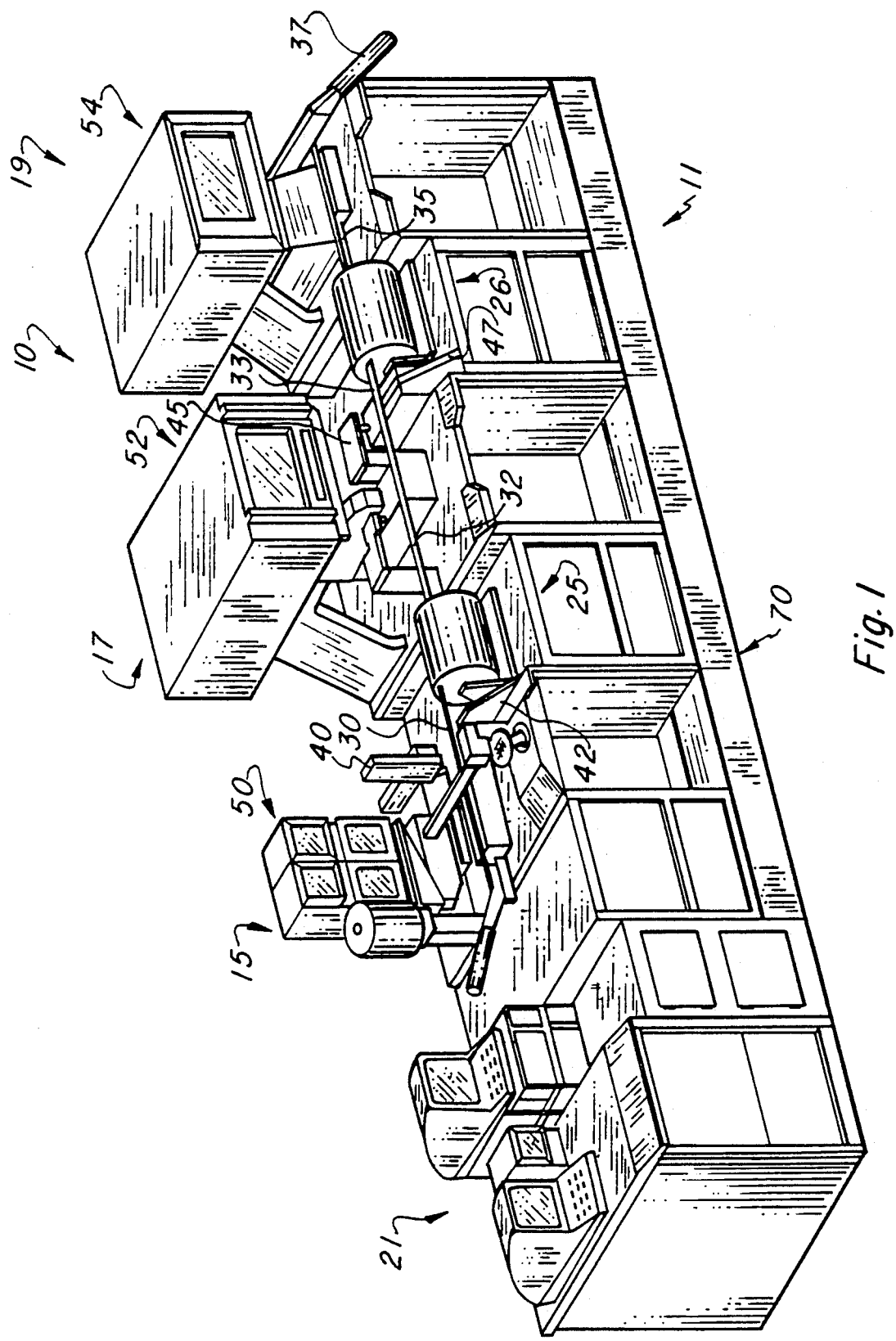
FIG. 1 is a perspective view of an integrated circuit package fabricating apparatus, in accordance with the invention.
Figure 2:
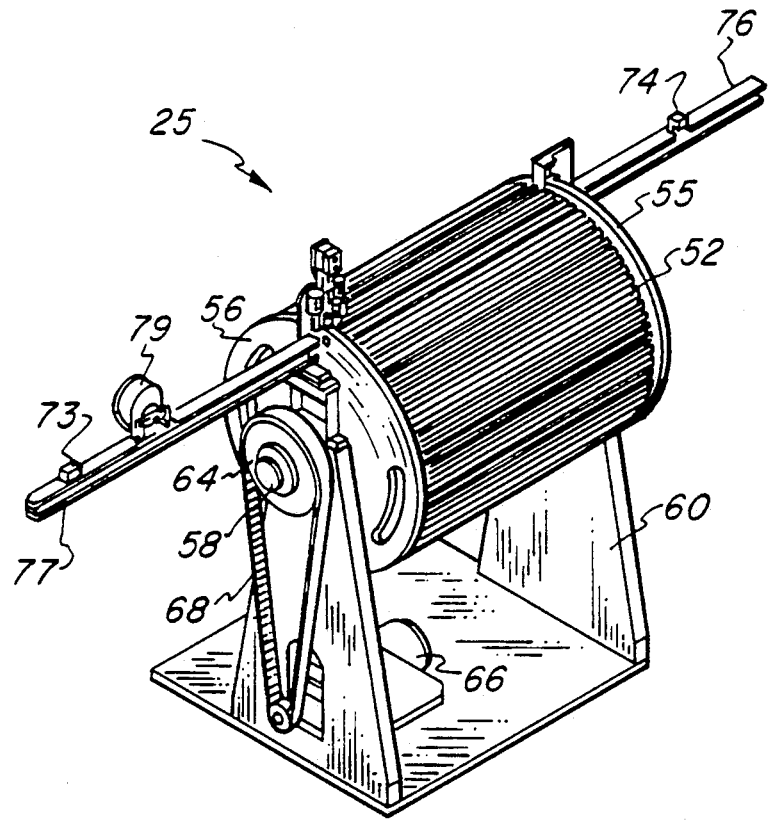
FIG. 2 is a perspective view of a rotary storage drum for receiving and selectively storing the integrated circuit elements during various stages of fabrication, in accordance with the invention.
Figure 5:
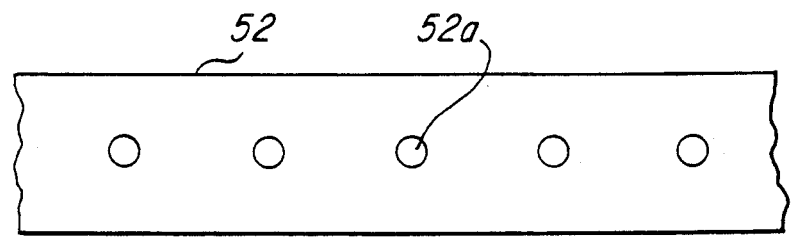
FIG. 5 is a top plan view of a portion of a device guide track.

An integrated circuit device manufacturing system 10 is shown in FIG. 1. The system 10 is shown in the context of a so called "C-dip" type package, however, those skilled in the art will appreciate that the principles of the invention are equally applicable to other types of device fabrication processes as well, for example, those dealing with plastic, hermetic, eprom type packages, and do on. The system 10 includes three workstations, which include, respectively, a header bar mounter 15, a bonder 17, and an inspection station 19. Each of the aforementioned work station equipment is known in the art, and all may be controlled by local computer equipment located, for example, at a general associated computer station 21. The first, second and third work stations are connected by rotary storage drum units 25 and 26, below described in detail with reference to FIG. 2. The entire assembly is carried on an appropriate base 11.

It can therefore be seen that each of the respective work stations 15, 17 and 19, together with the rotary drum storage units 25 and 26 comprise a complete in-line manufacturing system in which the manual steps previously required between workstations have been eliminated, and which the manufacturing process can be made completely automatic from start to finish. Thus, the various parts of the ultimate integrated circuit product devices are assembled beginning at the header bar mounting station 15 to be carried via a parts carrying channel or conveyer 30 to the rotary storage drum unit 25. Ideally, the manufactured units are continuously transported through the rotary storage drum unit 25 via a channel or conveyer 32 to the bonder 17 at the second work station. After the bonding operations have been completed, the bonded parts are moved via channel or conveyer 33 to the second rotary storage drum unit 26. Again, ideally, the units are moved directly through the rotary storage drum unit 26 to the channel or conveyer 35 to the inspection station 19 at the third work station. After final inspection, the units are discharged via chute 37 to a bin or other appropriate receiving means (not shown).

At this juncture it should be noted that quality inspection can be performed at each of the work stations. For example, the camera 40 is provided at the first work station to perform an initial quality inspection, controlled by the computer equipment 21, using inspection techniques known in the art. In the event that a particular part fails inspection, it can be diverted to a reject chute 42 rather than channel or conveyer 30. In like manner, a camera 45 can be provided at the bonding work station for inspection of the manufactured parts after bonding, again under the control of the camera computer 21. A reject chute 47 is provided to remove the rejected assemblies from the manufacturing line, rather than permitting them to continue the manufacturing process via chute, channel, or conveyer 33 for final inspection. Additionally, as is known, various monitors 50, 52, and 54 may be provided at the respective first, second and third work stations so that the manufacturing processes can be visually monitored, if desired.

Ideally, the fabrication rate of each of the work stations is designed or selected to be the same so that manufactured parts move at a constant rate from beginning to end during the manufacturing process. However, due to many diverse factors, often the rate of production at each work station varies due, for instance, to equipment breakdowns, failures, re-supply needs, and so on. If such event were to occur, it can be seen that if the bonder work station, for instance, were unable for a temporary period to receive parts from the header bar work station, the operation of the header bar mounter work station would necessarily need to be discontinued in its operation, or means must be provided for temporarily storing the parts produced by the header bar work station. Similarly, if the third work station were unable for a temporary period to receive parts from the second work station, the operation of the third work station would necessarily need to be discontinued in its operation until the supply were regained. To alleviate this problem, and in accordance with the invention, temporary storage between each of the workstations is provided by the rotary storage drum units 25 and 26, presently described with reference now to FIG. 2.

As will become apparent, the rotary storage drum units 25 and 26 operate on a last-in first-out basis in the device manufacturing process. Thus, if for example, the bonder at the second work station should temporarily malfunction, a number of partially manufactured devices will be stored in the rotary drum storage unit 25. Upon resumption of operation of the bonder unit, rather than continuing the manufacturing products with the first made units within the rotary storage drum unit 25, the last made units are channeled to the channel 32 and upon which the bonding operations can be performed. By utilizing such last-in first-out regimen, the overall cycle time between the initial steps of the process and final inspection is minimized. This is important so that if any part of the system should malfunction, the malfunction can be detected and corrected in a minimum amount of time before a large number of devices have been manufactured. As a point of reference, it is noted that an overall cycle time of approximately an hour or less has been achieved, with some units being passed through the unit in two to three minutes. This is in contrast to a typical through time of two to three days which was achieved in the prior manual operating methods.

The rotary storage drum 25, which, for purposes of illustration is similar to the rotary storage drum 26 shown in FIG. 1, includes a plurality of guide tracks and covers 52 mounted between circular frames 55 and 56. The guide tracks and covers 52 can be of appropriate size necessary to accommodate the style and size of the package or parts being processed, as will be apparent to those skilled in the art. It will be appreciated that the overall size of the drum 25 is a function of the product size, processing speed of the processing stations with which it is associated, and amount of storage desired. The drum is supported by a central shaft 58 mounted to a support stand 60 such that the central axis of the drum 25 is horizontal. A sprocket 62 is mounted to the central shaft 58, and a pulley 64 is provided coupled to a stepping motor 66 by a drive belt 68.

The overall control of the drum system is maintained by an eight-bit microprocessor unit (not shown), housed in a common control cabinet, such as cabinet 70, shown in FIG. 1, together with other peripheral power supplies, digital motor drive units, and signal input and output interfaces (also not shown).

Integrated circuit packages which are being processed which are inputted into and outputted from the drum 25 is achieved by forcing pressurized air through a series of pin sized holes 52a located at an accurate angle within the track surface such that when the integrated circuit packages move within the area of the holes, the horizontal force vector of escaping air drives the packages forward. It should be noted that the use of pressurized air to move integrated circuit packages or other particles is well known, and is not described in detail herein.

Control of the flow of the integrated circuit packages or particles is monitored by a series of non-contact sensors, such as sensors 73 and 74, at pertinent points on the input and output tracks, 76 and 77. The sensors work in conjunction with electrically actuated solenoids, such as solenoid 79, which act as physical escapement mechanisms control of the packages or particles. Additionally, the sensors, in conjunction with the software programs of the control microprocessor, allow real time tracking of the flow to allow optimum utilization of the drum unit and operator feedback on the performance and status of the system.

With the unit fabricated as described above, the system functions as follows. As an integrated circuit package or partially completed unit completes processing at the first station 21, it is moved to the input track section 77 of the drum assembly 25. The input sensor 73 registers the presence of the unit. The input drum sensor status is then checked to determine whether space is available within the active slot of the drum. The escapement controlled by the solenoid 79 is opened and the unit is transferred into the active guide track 52 via the air track actuation. If the active slot of the guide track 52 is full, the drum drive motor 66 is actuated to index the drum to the next available slot that is not full. Then the same actuation sequence is repeated as before to transfer successive units to the drum from the first processing station.

As the input track sensor 73 is being monitored, the output track sensor 74 is also monitored to assess the demand status of the second processing station 17. If units are required for the second processing station, the output escapement is opened, allowing units to pass directly from the input, through the drum, and on to the second station. If the second station is in demand, and no units are available from the first station, the drum is indexed to the next available slot containing units. Units which have been previously inputted from the first station are then transferred to the second station via the output air track 76 until demand is satisfied or all stored units are outputted.

Figure 3:
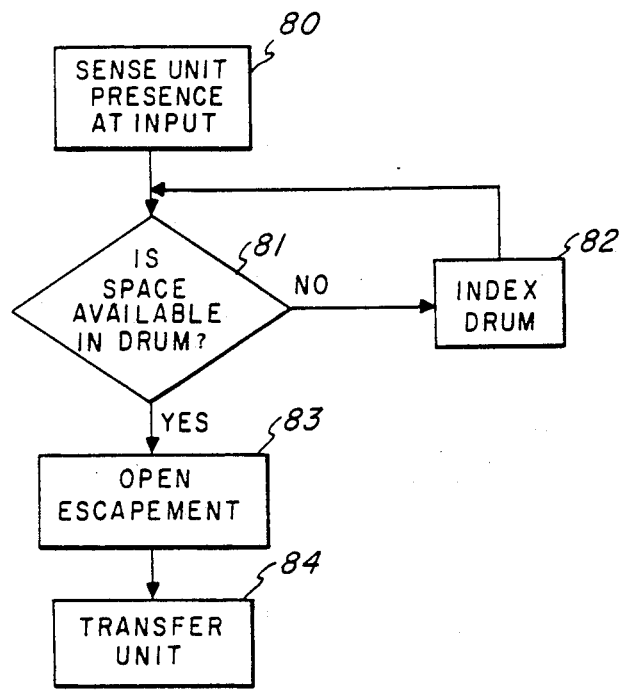
FIG. 3 is a flow chart illustrating the output operation of the rotary storage drum of FIG. 2 in conjunction with the operation of the apparatus for fabricating integrated circuit packages of FIG. 1.
Figure 4:
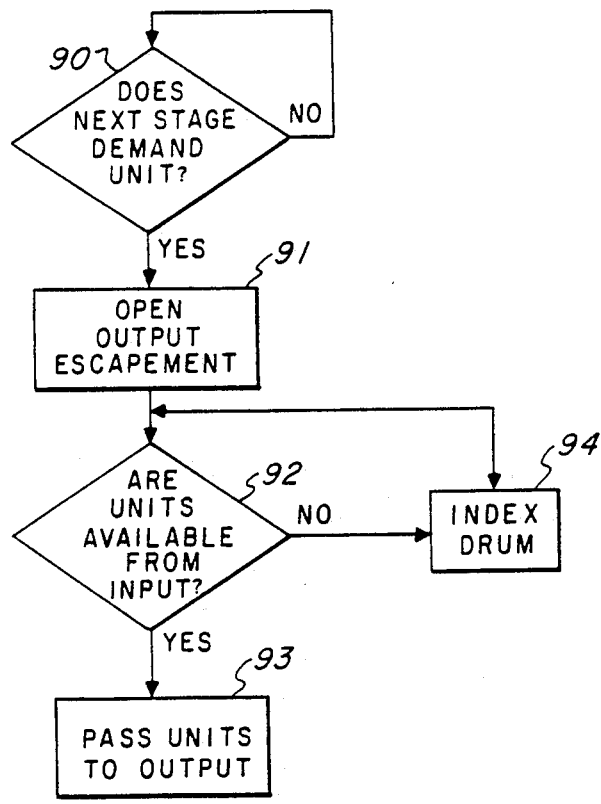
FIG. 4 is a flow chart illustrating the input operation of the rotary storage drum of FIG. 2 in conjunction with the operation of the apparatus for fabricating integrated circuit packages of FIG. 1.

The operation of the unit, in terms of the steps required in programming the control microprocessor are illustrated in the box diagrams of FIGS. 3 and 4. As shown in FIG. 3, the presence of a unit is sensed at the input to the drum, box 80. Then, a determination is made whether space is available in the drum, diamond 81. If no space is available, the drum is indexed, box 82, and the space available determination is repeated, box 81. On the other hand if space is available, the escapement is opened, box 83, and the unit is transferred into the drum, box 84.

At the output of the drum, as illustrated in FIG. 4, the status of the next subsequent stage beyond the drum is monitored, and a determination is made whether the next stage is demanding a unit for processing, diamond 90. If no unit is being demanded, the demand determination is merely looped or repeated until a unit is demanded. Then, the output escapement is opened, box 91. A determination is then made whether units are available from the input, diamond 92. If units are available, units are passed to the output, box 93. If no units are available from the input, the drum is indexed, and the test for available units in diamond 92 is repeated.

Although the invention has been described and illustrated with a certain degree of particularity, it is understood that the present disclosure has been made by way of example only and that numerous changes in the combination and arrangement of parts may be resorted to by those skilled in the art without departing from the spirit and the scope of the invention as hereinafter claimed.

What is claimed is:

1. Apparatus for conveying and staring integrated circuit devices, comprising:
   a first work station for producing a stream of devices, and a second work station for receiving the stream of devices;
   a drum buffer, axially in-line with said first and second work stations, for conveying the stream of devices between said first and second work stations and for storing and outputting individual devices on a substantially last-in first-out basis, said drum buffer having a plurality of device conveying and storing channels, having device conveying means integrally formed with said channels for driving the devices along said channels, formed axially along the length of said drum, wherein the channels include means for retaining the devices within the channels, and wherein each channel can store more than one of the individual devices;
   means for sensing the presence of devices at the input of said drum from said first work station;
   means for determining whether space is available in said drum to receive the devices;
   means for rotatably indexing said drum if no space is determined to be available to provide available space to receive the sensed devices;
   an input escapement for allowing the sensed devices to be conducted into said drum;
   and means for transferring the sensed devices into said drum.

2. The apparatus of claim 1 further comprising:
means for determining whether said second work station is demanding a device for processing;
an output escapement for enabling devices to be outputted from said drum;
means for determining whether devices are available from the first work station for delivery to the output, and
if devices are available, allowing the available devices to be outputted to said second work station; and if devices are not available, indexing said drum to make devices available which are stored in said drum and allowing the stored devices to be outputted to said second work station.

3. The apparatus of claim 1 wherein said first work station comprises a header bar mounting apparatus and said second work station comprises a bonder.

4. The apparatus of claim 1 wherein said first work station comprises a bonder and said second work station comprises an inspection station.

5. The apparatus of claim 2 wherein said means for determining whether devices are available from the first work station for delivery to the output, is also said means for sensing the presence of devices at the input of said drum from said first work station.

6. The apparatus of claim 1 wherein said device conveying means comprise pressurized air means for driving the devices in a forward direction along said channels.

7. The apparatus of claim 1 wherein said retaining means include a cover.

8. A method for conveying and storing integrated circuit devices, comprising:
providing at least a header bar mounting apparatus and a bonder, said header bar mounting apparatus producing an output stream of individual, separate devices for delivery to said bonder; and
providing a drum buffer, axially in-line with said header bar mounting apparatus and said bonder, for receiving the individual devices from said header bar mounting apparatus, for conveying the devices to said bonder, for temporarily storing the individual devices, and for dispensing the stored devices on a substantially last-in first-out basis to said bonder, said drum buffer having a plurality of device carrying channels, having device conveying means integrally formed with said channels for driving the devices along said channels, formed axially along the length of said drum, wherein the channels include means for retaining the devices within the channels, the devices being stored by filling the respective channels with a plurality of the devices, as said drum is indexed in one direction of rotation, and emptying the respective channels as said drum is indexed in an opposite direction of rotation;
sensing the presence of devices at the input of said drum;
determining whether space is available in said drum to receive the devices;
indexing said drum if no space is determined to be available to provide available space to receive the sensed devices;
opening an escapement to allow the sensed devices to be received into said drum;
and transferring the sensed devices into said drum.

9. The method of claim 8 further comprising the steps of:
determining whether said bonder is demanding a device for processing;
opening an output escapement from said drum;
determining whether devices are available from the input for delivery to the output, and if devices are available, allowing the input available devices to be outputted to said bonder; and if devices are not available, indexing said drum to make devices available which are stored in said drum and allowing the stored devices to be outputted to said bonder.

10. The method of claim 8 wherein said device conveying means comprise pressurized air means for driving the devices in a forward direction along said channels.

11. The method of claim 8 wherein said retaining means include a cover.

12. An in-line system for conveying and storing integrated circuit devices, comprising:
at least first and second integrated circuit processing stations, said first station producing an output stream of individual, separate devices for delivery to said second station;
a drum buffer, axially in-line with said first and second processing stations, for receiving the individual devices from said first station, for selectively storing or transferring directly, axially, through said drum the individual devices, wherein the devices stored are dispensed on a substantially last-in first-out basis to said second station;
a plurality of device carrying guide tracks, having device conveying means integrally formed with said tracks for driving the devices along said tracks, axially along the length of said drum, wherein the tracks include means for retaining the devices within the tracks, and wherein the devices are stored by filling the respective guide tracks with a plurality of the devices as said drum is rotatably indexed in one direction, and dispensed by emptying the stored devices from the respective guide tracks as said drum is rotatably indexed in the opposite direction, and wherein the devices are transferred directly through said drum by fixing the position of said drum and then transferring the devices along said guide tracks;
an input track for transferring the devices from said first station to one of said drum guide tracks; and
an output track for transferring the devices from said drum guide track to said second station.

13. The in-line system of claim 12 further comprising:
pressurized air means for driving the devices in a forward direction along said input track and said output track, wherein said device conveying means comprise pressurized air means for driving the devices in a forward direction along said guide tracks.

14. The system of claim 12 wherein said retaining means include a cover.

15. A system for conveying and storing integrated circuit devices, comprising:
at least first and second integrated circuit processing stations, said first station producing an output stream of individual, separate devices for delivery to said second station;
and a drum buffer for receiving the devices from said first station, for conveying the devices, for selectively storing the devices, and for dispensing the stored devices on a substantially last-in first-out basis to said second station;

said drum buffer having a plurality of channels for conveying and storing devices, wherein each of said channels has device conveying means integrally formed with said each channel for driving the devices along said each channel, and wherein each of said channels includes means for retaining the devices within said each channel.

16. The system of claim 15 wherein said device conveying means comprise pressurized air means for driving the devices in a forward direction along said channels.

17. The system of claim 15 wherein said retaining means include a cover.

18. The system of claim 15 further comprising computer means for operating said system.

19. The system of claim 16 further comprising:

an input air track for conveying devices from said first station to said drum buffer; and an output air track for conveying devices from said drum buffer to said second station.

20. A drum buffer for selectively conveying and storing integrated circuit devices, comprising:

a drum;

a plurality of channels for conveying and storing devices, wherein said channels are axially disposed on the surface of said drum;

device conveying means integral with each channel for propelling the devices along said channel; and retaining means integral with each channel, for confining devices within a channel.

21. The drum buffer of claim 20 wherein said device conveying means include an air track for propelling the devices in a desired direction along said each channel.

22. The drum buffer of claim 20 wherein said retaining means include a cover.

* * * * *